United States Patent
Lin et al.

(10) Patent No.: US 11,355,490 B2
(45) Date of Patent: Jun. 7, 2022

(54) SEMICONDUCTOR STRUCTURE AND ELECTROSTATIC DISCHARGE PROTECTION CIRCUIT

(71) Applicants: GLOBAL UNICHIP CORPORATION, Hsinchu (TW); TAIWAN SEMICONDUCTOR MANUFACTURING CO., LTD., Hsinchu (TW)

(72) Inventors: Chun-Yu Lin, Hsinchu (TW); Chun-Cheng Chen, Hsinchu (TW); Wen-Tai Wang, Hsinchu (TW)

(73) Assignees: GLOBAL UNICHIP CORPORATION, Hsinchu (TW); TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/096,930

(22) Filed: Nov. 12, 2020

(65) Prior Publication Data

US 2022/0068908 A1    Mar. 3, 2022

(30) Foreign Application Priority Data

Aug. 31, 2020  (TW) .................... 109129680

(51) Int. Cl.
*H01L 27/02*     (2006.01)
*H02H 9/04*      (2006.01)

(52) U.S. Cl.
CPC ......... *H01L 27/0248* (2013.01); *H02H 9/046* (2013.01)

(58) Field of Classification Search
CPC ........................... H01L 27/0248; H02H 9/046
USPC .......................................................... 361/56
See application file for complete search history.

(56) References Cited

U.S. PATENT DOCUMENTS

| | | | |
|---|---|---|---|
| 2015/0138678 A1* | 5/2015 | Parthasarathy | H01L 27/0255 361/56 |
| 2017/0244244 A1* | 8/2017 | Ikeda | H01L 29/744 |
| 2020/0227914 A1* | 7/2020 | Salcedo | H02H 9/046 |
| 2020/0286889 A1* | 9/2020 | Salcedo | H01L 27/0262 |

* cited by examiner

*Primary Examiner* — Dharti H Patel
(74) *Attorney, Agent, or Firm* — CKC & Partners Co., LLC

(57) ABSTRACT

A semiconductor structure corresponds to a first diode and a second diode connected in series. A first well region is on a first deep well region. Two second well regions are at two sides of the first well region respectively. A first doping region and a second doping region are on the first well region. A first isolation region is between the first doping region and the second doping region. A third well region is on a second deep well region. Two fourth well regions are at two sides of the third well region respectively. A third doping region and a fourth doping region are on the third well region. A second isolation region is between the third doping region and the fourth doping region. The second doping region and third doping region are connected. The second deep well region is separated from the first deep well region.

8 Claims, 7 Drawing Sheets

SEMICONDUCTOR STRUCTURE AND ELECTROSTATIC DISCHARGE PROTECTION CIRCUIT

RELATED APPLICATIONS

This application claims priority to Taiwanese Application Serial Number 109129680, filed Aug. 31, 2020, which is herein incorporated by reference.

BACKGROUND

Technical Field

The present disclosure relates to a semiconductor technology. More particularly, the present disclosure relates to a semiconductor structure of a diode string and an electrostatic discharge protection circuit having this diode string.

Description of Related Art

With developments of integrated circuit technology, sizes of transistors become smaller. Accordingly, withstand voltages of the transistors become smaller. For prevent the electrostatic discharge (ESD) applying electrical overstress (EOS) on the integrated circuits, electrostatic discharge protection circuits are used to protect the integrated circuits.

However, parasitic capacitance values of the electrostatic discharge protection circuits in some related approaches are larger, and thus these electrostatic discharge protection circuits are not suitable for high speed applications.

SUMMARY

Some aspects of the present disclosure are to provide a semiconductor structure. The semiconductor structure is corresponding to a first diode and a second diode. The first diode and the second diode are connected in series. The semiconductor structure includes a first deep well region, a first well region, two second well regions, a first doping region, a second doping region, a second deep well region, a third well region, two fourth well regions, a third doping region, and a fourth doping region. The first deep well region is disposed on a substrate. The first well region is disposed on the first deep well region. The two second well regions are disposed at two sides of the first well region respectively. The first doping region is disposed on the first well region. The second doping region is disposed on the first well region. A first isolation region is disposed between the first doping region and the second doping region. The second deep well region is disposed on the substrate. The third well region is disposed on the second deep well region. The two fourth well regions are disposed at two sides of the third well region respectively. The third doping region is disposed on the third well region. The fourth doping region is disposed on the third well region. A second isolation region is disposed between the third doping region and the fourth doping region. The second doping region is connected to the third doping region. The second deep well region is separated from the first deep well region.

In some embodiments, the first deep well, the second deep well, the two second well regions, the second doping region, the two fourth well regions, and the fourth doping region are N type, wherein the first well region, the first doping region, the third well region, and the third doping region are P type.

In some embodiments, the semiconductor structure further includes a fifth well region. The fifth well region is disposed between one of the two second well regions and one of the two fourth well regions. The fifth well region is P type.

In some embodiments, the substrate includes a protrusion portion, and the protrusion portion is between the second deep well region and the first deep well region.

Some aspects of the present disclosure are to provide an electrostatic discharge protection circuit. The electrostatic discharge protection circuit includes a first diode string. The first diode string includes a plurality of first diodes. The first diodes are connected in series between an input/output terminal and a power voltage. A semiconductor structure of the first diode string includes a first deep well region, a first well region, two second well regions, a first doping region, a second doping region, a second deep well region, a third well region, two fourth well regions, a third doping region, and a fourth doping region. The first deep well region is disposed on a substrate. The first well region is disposed on the first deep well region. The two second well regions are disposed at two sides of the first well region respectively. The first doping region is disposed on the first well region. The second doping region is disposed on the first well region. A first isolation region is disposed between the first doping region and the second doping region. The second deep well region is disposed on the substrate. The third well region is disposed on the second deep well region. The two fourth well regions are disposed at two sides of the third well region respectively. The third doping region is disposed on the third well region. The fourth doping region is disposed on the third well region. A second isolation region is disposed between the third doping region and the fourth doping region. The second doping region is connected to the third doping region. The second deep well region is separated from the first deep well region. If a first electrostatic discharge even occurs at the input/output terminal, a first electrostatic discharge current flows through the first diode string.

In some embodiments, the first deep well, the second deep well, the two second well regions, the second doping region, the two fourth well regions, and the fourth doping region are N type, wherein the first well region, the first doping region, the third well region, and the third doping region are P type.

In some embodiments, the substrate includes a protrusion portion, and the protrusion portion is between the second deep well region and the first deep well region.

In some embodiments, the first doping region is an anode terminal of the first diode string, and the fourth doping region is a cathode terminal of the first diode string.

In some embodiments, the electrostatic discharge protection circuit further includes a second diode string. The second diode string includes a plurality of second diodes. The second diodes are connected in series between the input/output terminal and a ground terminal. If a second electrostatic discharge even occurs at the input/output terminal, a second electrostatic discharge current flows to the ground terminal through the second diode string.

In some embodiments, the first electrostatic discharge current is a positive current, and the second electrostatic discharge current is a negative current.

As described above, the semiconductor structure of the present disclosure has a smaller parasitic capacitance value, and thus it can be applied in high-speed applications.

BRIEF DESCRIPTION OF THE DRAWINGS

The disclosure can be more fully understood by reading the following detailed description of the embodiment, with reference made to the accompanying drawings as follows.

DETAILED DESCRIPTION

The embodiments in the following descriptions are described in detail with the accompanying drawings, but the examples provided are not intended to limit the scope of the disclosure covered by the present disclosure. The structure and operation are not intended to limit the execution order. Any structure regrouped by elements, which has an equal effect, is covered by the scope of the present disclosure. In addition, the drawings are merely for illustration and are not illustrated according original sizes. For ease of understanding, the same or similar components in the following descriptions will be described with the same symbols.

It will be understood that, although the terms first, second, third etc. may be used in the present disclosure to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present disclosure.

Figure 1A:
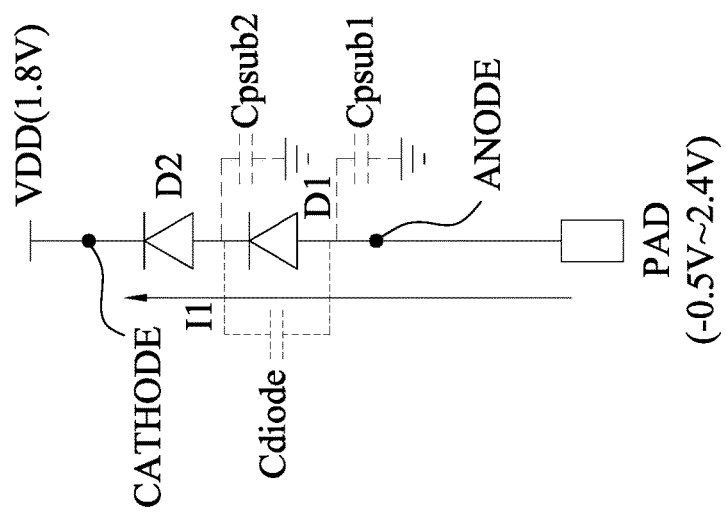
FIG. 1A is a schematic diagram of an electrostatic discharge protection circuit according to some embodiments of the present disclosure.

Reference is made to FIG. 1A. FIG. 1A is a schematic diagram of an electrostatic discharge protection circuit 100A according to some embodiments of the present disclosure. As illustration in FIG. 1A, the electrostatic discharge protection circuit 100A includes an input/output terminal PAD and diodes D1-D2.

In some embodiments, the input/output terminal PAD may be a pad and coupled to other core devices. The diodes D1-D2 are connected in series to form a diode string. The diode string includes an anode terminal ANODE and a cathode terminal CATHODE. The anode terminal ANODE is coupled to the input/output terminal PAD. The cathode terminal CATHODE is coupled to a power voltage VDD.

In some embodiments, a range of a voltage received by the input/output terminal PAD may be from −0.5 volts to 2.4 volts, the power voltage VDD may be 1.8 volts. The voltage value of the input/output terminal PAD and the voltage value of the power voltage VDD above are merely for illustration, and various suitable voltage values are within the contemplated scopes of the present disclosure.

In operation, if there is no electrostatic discharge (ESD) event at the input/output terminal PAD, the diodes D1-D2 are not turned on. If an electrostatic discharge event with a positive current occurs at the input/output terminal PAD, the diodes D1-D2 are turned on, such that an electrostatic discharge current 11 (positive current) flows to the power voltage VDD through the diodes D1-D2. For example, if the electrostatic discharge event at the input/output terminal PAD causes that a voltage of the input/output terminal PAD is higher than the power voltage VDD and a difference between the voltage of the input/output terminal PAD and the power voltage VDD is greater than the turned-on voltage of two diodes, the diodes D1-D2 are turned on. In this situation, the electrostatic discharge current 11 (positive current) flows to the cathode terminal CATHODE (the power voltage VDD) through the turned-on diodes D1-D2, to prevent other circuits from operating abnormally due to the electrostatic discharge events.

Figure 1B:
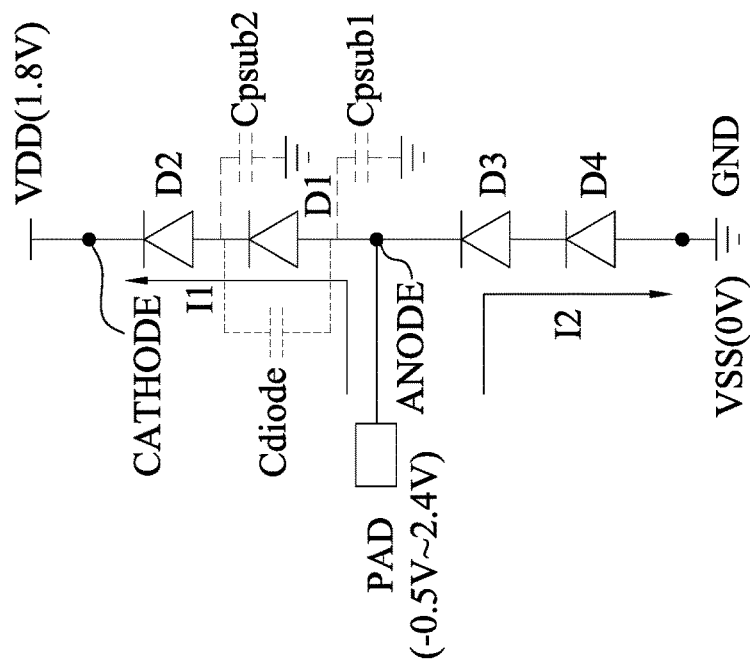
FIG. 1B is a schematic diagram of an electrostatic discharge protection circuit according to some embodiments of the present disclosure.

Reference is made to FIG. 1B. FIG. 1B is a schematic diagram of an electrostatic discharge protection circuit 100B according to some embodiments of the present disclosure. A main difference between the electrostatic discharge protection circuit 100B in FIG. 1B and the electrostatic discharge protection circuit 100A in FIG. 1A is that, the discharge protection circuit 100B further includes diodes D3-D4. The diodes D3-D4 are coupled in series to form another diode string. As illustrated in FIG. 1B, the diode D3 is coupled to the input/output terminal PAD, and the diode D4 is coupled to a ground terminal GND. A ground voltage VSS of the ground terminal GND is 0 volt.

In operation, if there is no electrostatic discharge event at the input/output terminal PAD, the diodes D3-D4 are not turned on. If an electrostatic discharge event with a negative current occurs at the input/output terminal PAD, the diodes D3-D4 are turned on such that an electrostatic discharge current 12 (negative current) flows to the ground terminal GND through the diodes D3-D4. For example, if the electrostatic discharge event occurs at the input/output terminal PAD such that the ground voltage VSS is higher than the voltage of the input/output terminal PAD and a difference between the ground voltage VSS and the voltage of the input/output terminal PAD is greater than a turned-on voltage of the two diodes, the diodes D3-D4 are turned on. In this situation, the electrostatic discharge current 12 (negative current) flows to the ground terminal GND through the diodes D3-D4, to prevent other circuits from operating abnormally due to the electrostatic discharge events.

Figure 2:
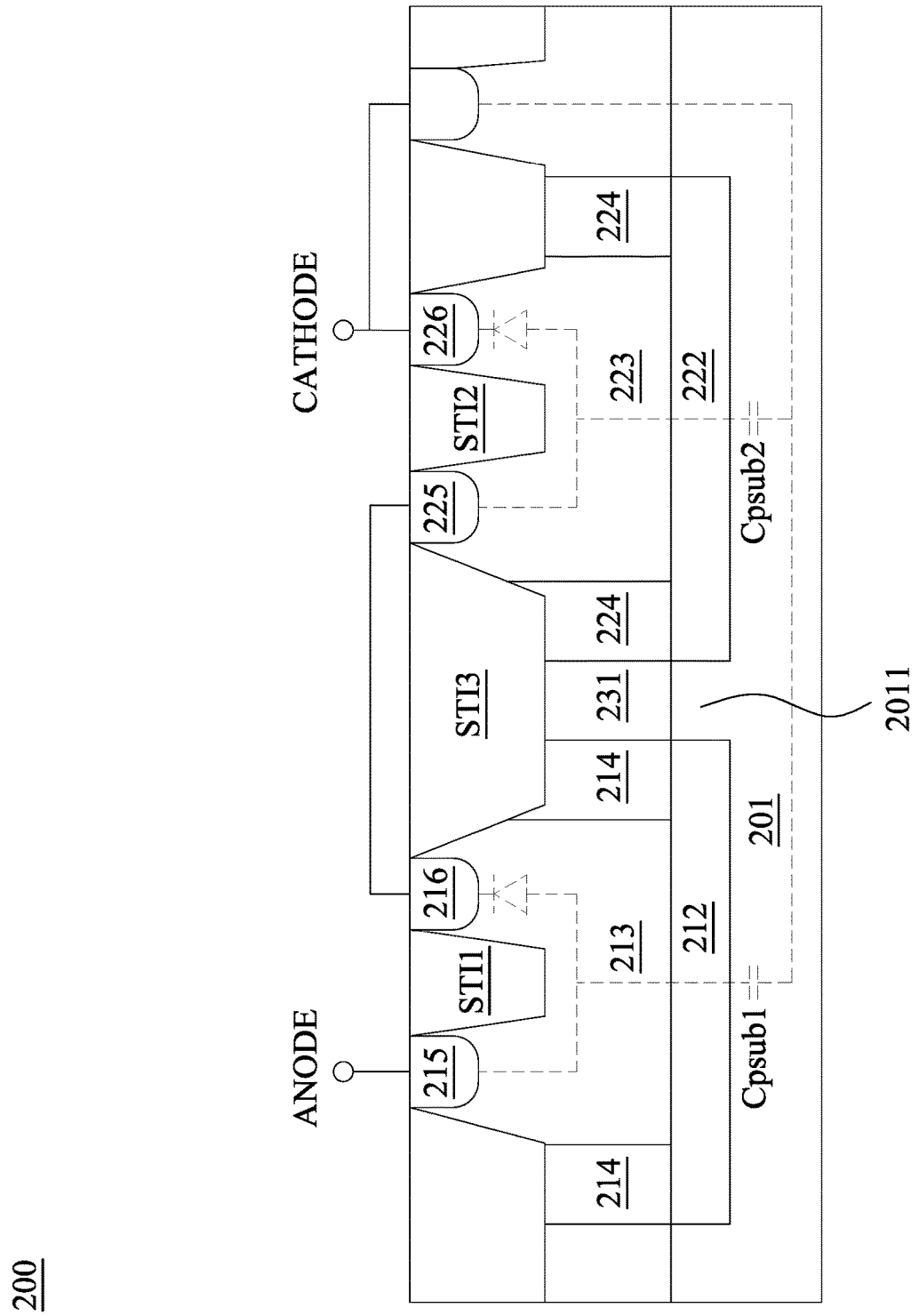
FIG. 2 is a schematic diagram of a semiconductor structure according to some embodiments of the present disclosure.

Reference is made to FIG. 2. FIG. 2 is a schematic diagram of a semiconductor structure 200 according to some embodiments of the present disclosure. In some embodiments, the semiconductor structure 200 in FIG. 2 is configured to implement the diodes D1-D2 in FIG. 1A or FIG. 1B.

As illustrated in FIG. 2, the semiconductor structure 200 includes a substrate 201, a first deep well region 212, a first well region 213, two second well regions 214, a first doping region 215, a second doping region 216, a second deep well region 222, a third well region 223, two fourth well regions 224, a third doping region 225, and a fourth doping region 226.

The first deep well region 212 is disposed on the substrate 201. The first well region 213 is disposed on the first deep well region 212. The two second well regions 214 are disposed at two sides of the first well region 213. The first doping region 215 is disposed on the first well region 213. The second doping region 216 is disposed on the first well region 213. A first isolation region STI1 is disposed between the first doping region 215 and the second doping region 216.

Similarly, the second deep well region 222 is disposed on the substrate 201. The second deep well region 222 is separated from the first deep well region 212. As illustrated in FIG. 2, a protrusion portion 2011 of the substrate 201 is disposed between the second deep well region 222 and the first deep well region 212. In addition, the third well region 223 is disposed on the second deep well region 222. The two fourth well regions 224 are disposed at two sides of the third well region 223. The third doping region 225 is disposed on the third well region 223. The fourth doping region 226 is disposed on the third well region 223. A second isolation region STI2 is disposed between the third doping region 225 and the fourth doping region 226. In addition, a third isolation region STI3 is disposed between the third doping region 225 and the second doping region 216, and a fifth well region 231 is disposed between one of the two second well regions 214 and one of the two fourth well regions 224.

In some embodiments, the first deep well region 212, the second deep well region 222, the two second well regions 214, the second doping region 216, the two fourth well regions 224, and the fourth doping region 226 are N type, and the substrate 201, the first well region 213, the first doping region 215, the third well region 223, and the third doping region 225 are P type, but the present disclosure is not limited thereto.

Figure 3:
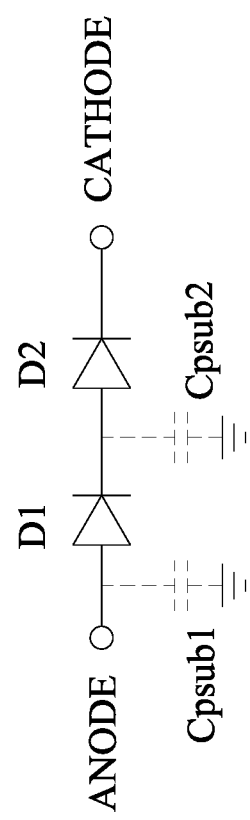
FIG. 3 is an equivalent circuit diagram of the semiconductor structure in FIG. 2 according to some embodiments of the present disclosure.

FIG. 3 is an equivalent circuit diagram of the semiconductor structure 200 in FIG. 2 according to some embodiments of the present disclosure.

References are made to FIG. 1A to FIG. 3. The first doping region 215 in FIG. 2 forms the anode terminal ANODE in FIG. 1A (or FIG. 1B or FIG. 3), and the fourth doping region 226 in FIG. 2 forms the cathode terminal CATHODE in FIG. 1A (or FIG. 1B or FIG. 3). The diode D1 in FIG. 1A (or FIG. 1B or FIG. 3) is formed by the first well region 213 and the second doping region 216 in FIG. 2, and the diode D2 in FIG. 1A (or FIG. 1B or FIG. 3) is formed by the third well region 223 and the fourth doping region 226 in FIG. 2. In addition, the connection between the second doping region 216 and the third doping region 225 in FIG. 2 is equivalent to the connection between the diode D1 and the diode D2 in series in FIG. 1A (or FIG. 1B or FIG. 3).

In some related approaches, the semiconductor structure is without the first deep well region 212 and the second deep well region 222. In these configurations, power leakage often occurs.

Compared to the aforementioned related approaches, in the present disclosure, the first deep well region 212 separates the first well region 213 (for example, P type) from the substrate 201 (for example, P type), and the second deep well region 222 separates the third well region 223 (for example, P type) from the substrate 201 (for example, P type). Accordingly, it can avoid power leakage and the semiconductor structure 200 can be applied in the applications with negative power. In some embodiments, the first deep well region 212 and the second deep well region 222 may be in a floating state.

As illustrated in FIG. 2, a first parasitic capacitor Cpsub1 is formed between the first deep well region 212 and the substrate 201. The parasitic capacitance value of the first parasitic capacitor Cpsub1 is associated with a contact area between the first deep well region 212 and the substrate 201. For example, the parasitic capacitance value of the first parasitic capacitor Cpsub1 is proportional to the contact area between the first deep well region 212 and the substrate 201. Similarly, a second parasitic capacitor Cpsub2 is formed between the second deep well region 222 and the substrate 201. The parasitic capacitance value of the second parasitic capacitor Cpsub2 is associated with a contact area between the second deep well region 222 and the substrate 201. For example, the parasitic capacitance value of the second parasitic capacitor Cpsub2 is proportional to the contact area between the second deep well region 222 and the substrate 201.

In some embodiments, the size of the first deep well region 212 is the same to the size of the second deep well region 222. For example, the length, the width, and the height of the first deep well region 212 are the same to the length, the width, and the height of the second deep well region 222. In some other embodiments, the size of the first deep well region 212 is different from the size of the second deep well region 222.

In some related approaches, a single larger N type deep well region is under the first well region 213 and the third well region 223. In other words, the first well region 213 and the third well region 223 are disposed on this single larger N type deep well region. In this configuration, a parasitic capacitor with a larger capacitance value is formed at the anode terminal ANODE in FIG. 1A (or FIG. 1B or FIG. 3). Based on formula (1) below, if the frequency f is very low, the impedance Z is very larger. Accordingly, if the frequency f is very high, the capacitance value C needs to be designed to be small to increase the impedance, such that the insertion loss is decreased.

$$Z = \frac{1}{jwC} = \frac{1}{j2\pi fC} \quad (1)$$

Compared to the aforementioned related approaches, the semiconductor structure 200 of the present disclosure adopts two separated and smaller N type deep well region (the first deep well region 212 and the second deep well region 222). In this configuration, the first parasitic capacitor Cpsub1 and the second parasitic capacitor Cpsub2 with smaller parasitic capacitance values are formed in FIG. 1A (or FIG. 1B or FIG. 3). In addition, as illustrated in FIG. 1A and FIG. 1B, the second parasitic capacitor Cpsub2 and the diode capacitor Cdiode are in a cascode form. Formula (2-1) and formula (2-2) is below:

$$C\_total = C_{diode//psub2} + C\_psub1 \quad (2\text{-}1)$$

$$\frac{1}{C_{diode//psub2}} = \frac{1}{C\_diode} + \frac{1}{C\_psub2} \quad (2\text{-}2)$$

C_total is a total capacitance value, C_diode is a capacitance value of the diode capacitor Cdiode, C_psub1 is a capacitance value of the first parasitic capacitor Cpsub1, and C_psub2 is a capacitance value of second parasitic capacitor Cpsub2.

Based on the aforementioned formula (2-1) and formula (2-2), if the second parasitic capacitor Cpsub2 and the diode capacitor Cdiode are in a cascaode form, the total capacitance value C_total decreases. Since the total capacitance value C_total decreases, the impedance is increased to reduce the insertion loss (based on formula (1)). Accordingly, the semiconductor structure 200 of the present disclosure can be applied in the high speed applications. The applications with high speeds are, for example but not limited to, radio frequency technology.

Figure 4:
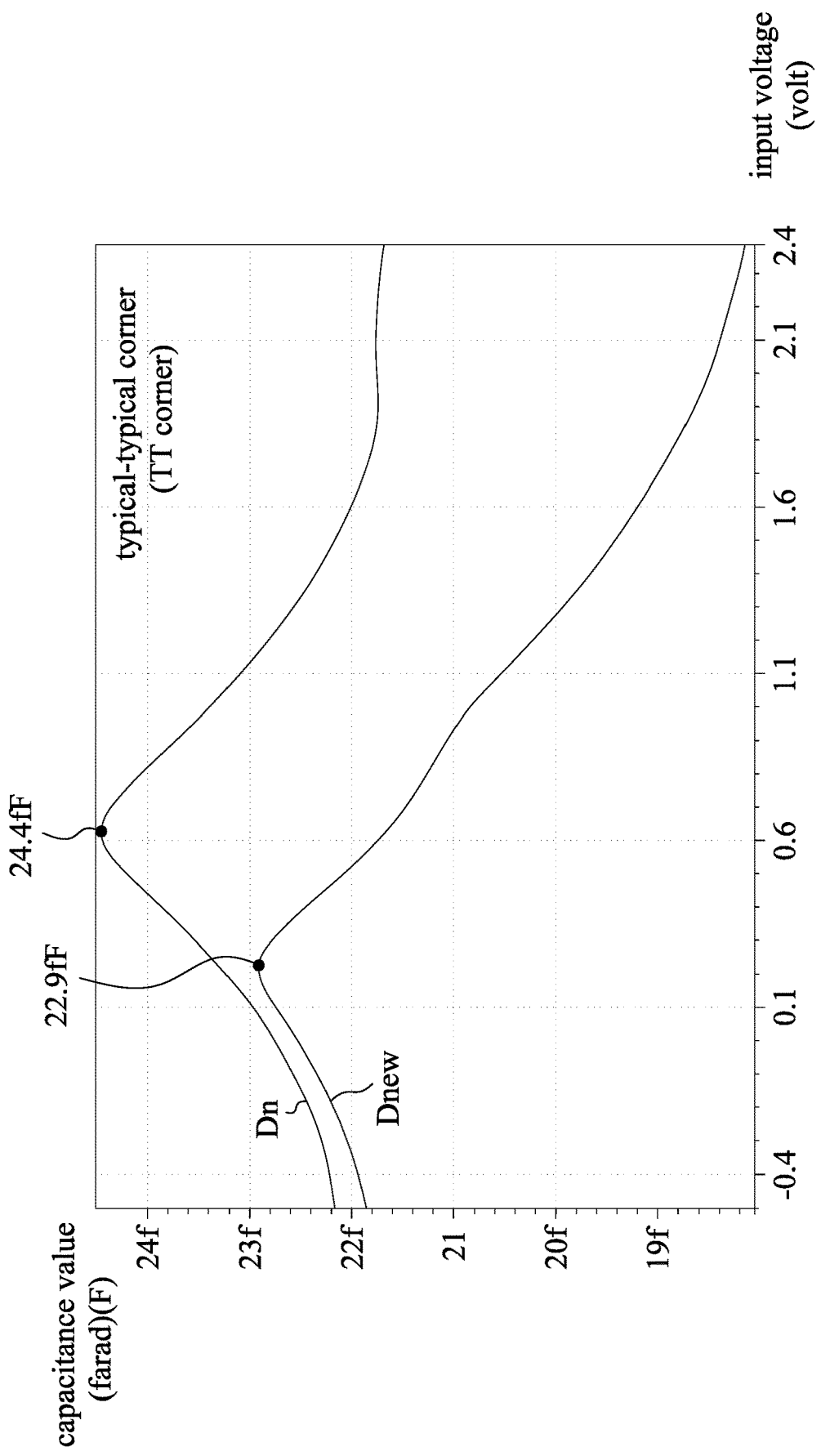
FIG. 4 is a schematic diagram of a relationship of a parasitic capacitance value and an input voltage in a typical-typical corner according to some embodiments of the present disclosure.

Reference is made to FIG. 4. FIG. 4 is a schematic diagram of a relationship of a parasitic capacitance value and an input voltage in a typical-typical corner (TT corner) according to some embodiments of the present disclosure. In other words, FIG. 4 illustrates the relationship of the parasitic capacitance value and the input voltage measured under a room temperature in an operating condition where the N type transistors and P type transistors operate in typical speeds. The input voltage (−0.5 volts to 2.4 volts) is the received voltage received at the input/output terminal PAD in FIG. 1A or FIG. 1B. As illustrated in FIG. 4, the parasitic capacitance value Dnew of the present disclosure (adopting two separated and smaller N type deep well regions 212 and 222) in the typical-typical corner is less than the parasitic capacitance value Dn of other related approaches (adopting a single larger N type deep well region). Accordingly, the impedance of the present disclosure is increased effectively to reduce the insert loss.

Figure 5:
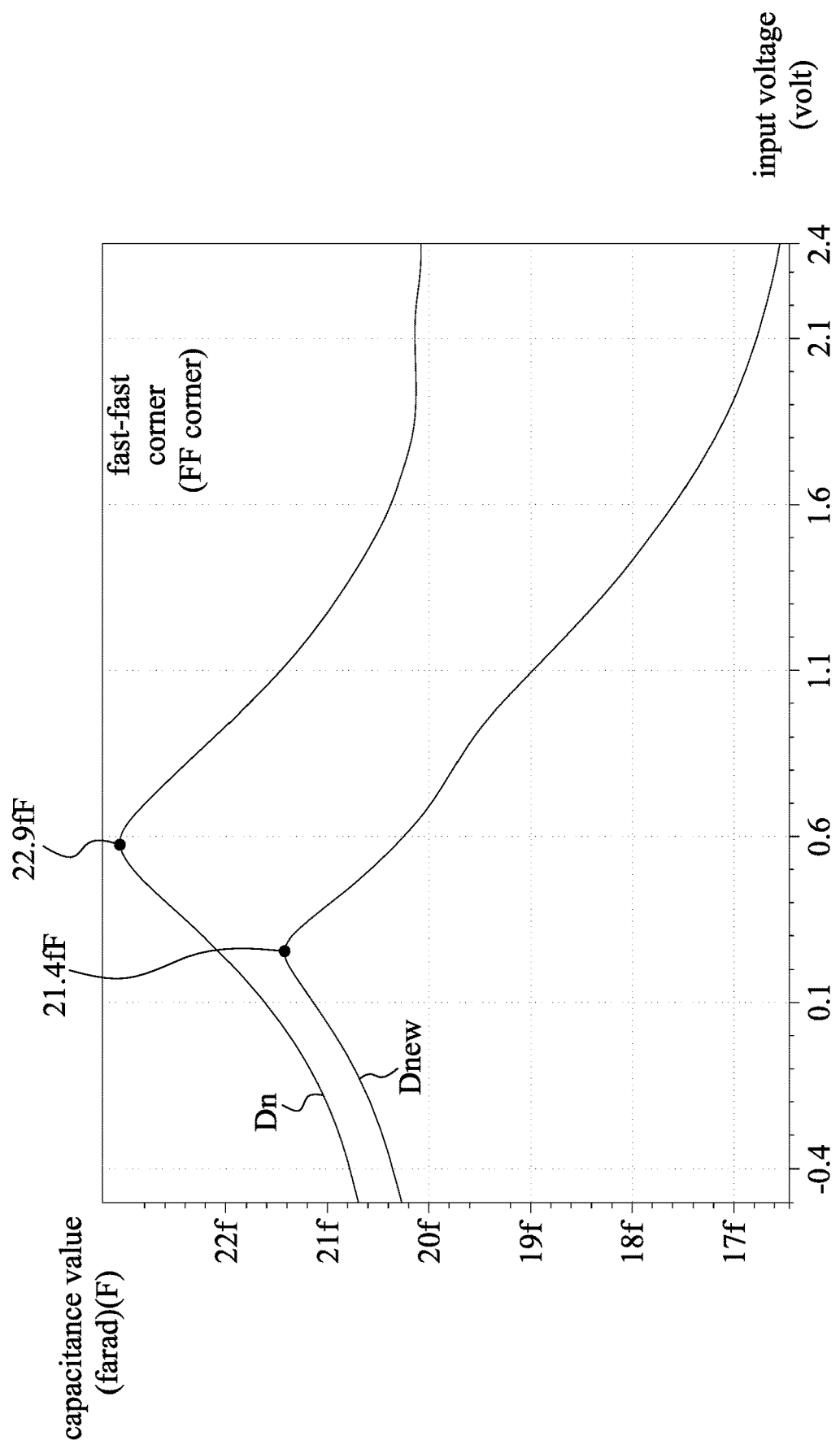
FIG. 5 is a schematic diagram of a relationship of a parasitic capacitance value and an input voltage in a fast-fast corner according to some embodiments of the present disclosure.

Reference is made to FIG. 5. FIG. 5 is a schematic diagram of a relationship of a parasitic capacitance value and an input voltage in a fast-fast corner (FF corner) according to some embodiments of the present disclosure. In other words, FIG. 5 illustrates the relationship of the parasitic capacitance value and the input voltage measured under a room temperature in an operating condition where the N type transistors and P type transistors operate in fast speeds. As illustrated in FIG. 5, the parasitic capacitance value Dnew of the present disclosure (adopting two separated and smaller N type deep well regions 212 and 222) in the typical-typical corner is less than the parasitic capacitance value Dn of other related approaches (adopting a single larger N type deep well region). Accordingly, the impedance of the present disclosure is increased effectively to reduce the insert loss.

Figure 6:
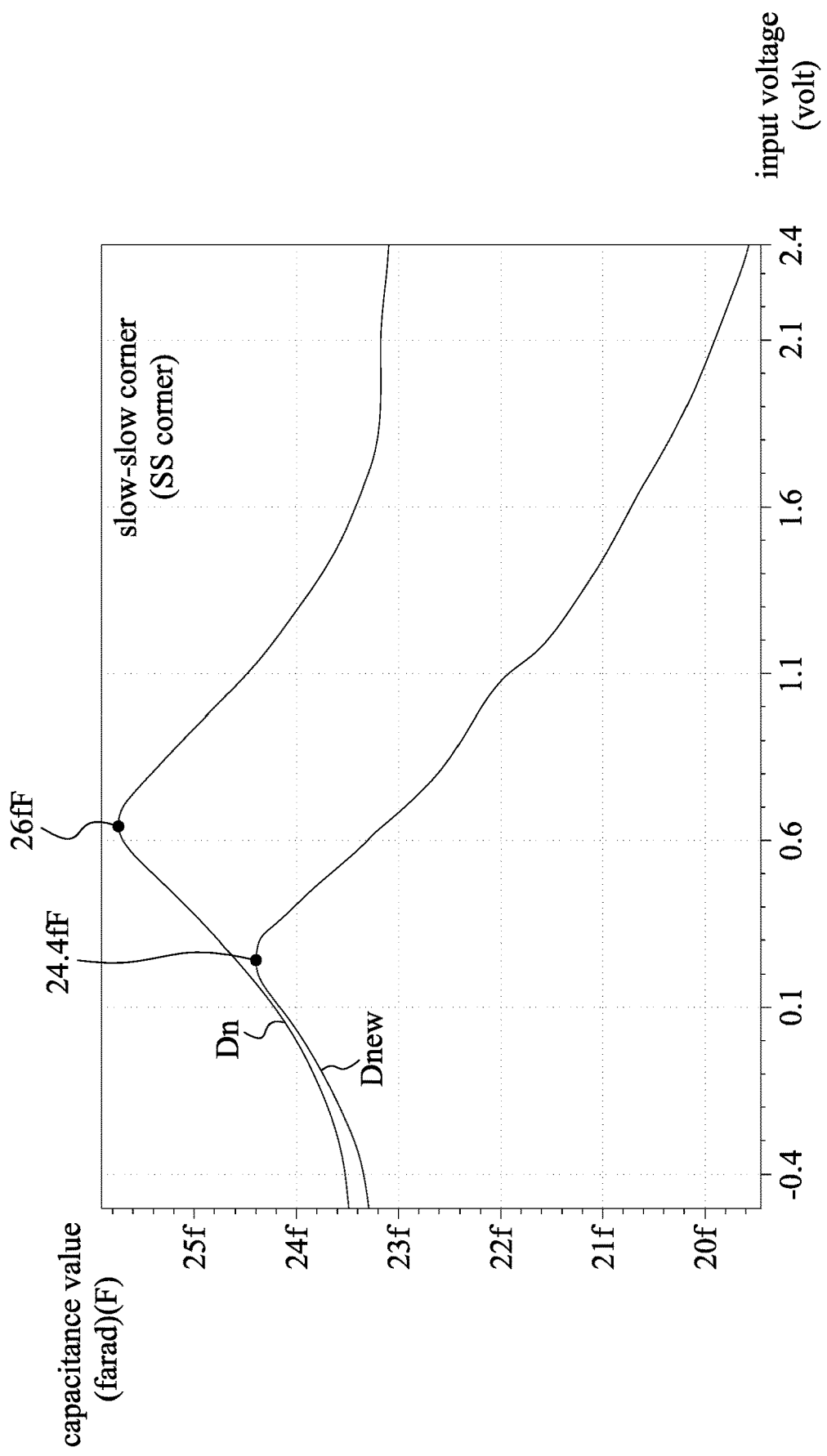
FIG. 6 is a schematic diagram of a relationship of a parasitic capacitance value and an input voltage in a slow-slow corner according to some embodiments of the present disclosure.

Reference is made to FIG. 6. FIG. 6 is a schematic diagram of a relationship of a parasitic capacitance value and an input voltage in a slow-slow corner (SS corner) according to some embodiments of the present disclosure. In other words, FIG. 6 illustrates the relationship of the parasitic capacitance value and the input voltage measured under a room temperature in an operating condition where the N type transistors and P type transistors operate in slow speeds. As illustrated in FIG. 6, the parasitic capacitance value Dnew of the present disclosure (adopting two separated and smaller N type deep well regions 212 and 222) in the typical-typical corner is less than the parasitic capacitance value Dn of other related approaches (adopting a single larger N type deep well region). Accordingly, the impedance of the present disclosure is increased effectively to reduce the insert loss.

As described above, the semiconductor structure of the present disclosure has a smaller parasitic capacitance value, and thus it can be applied in high-speed applications.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A semiconductor structure corresponding to a first diode and a second diode, wherein the first diode and the second diode are connected in series, wherein the semiconductor structure comprises:
    a first deep well region disposed on a substrate;
    a first well region disposed on the first deep well region;
    two second well regions disposed at two sides of the first well region respectively;
    a first doping region disposed on the first well region;
    a second doping region disposed on the first well region, wherein a first isolation region is disposed between the first doping region and the second doping region;
    a second deep well region disposed on the substrate;
    a third well region disposed on the second deep well region;
    two fourth well regions disposed at two sides of the third well region respectively;
    a third doping region disposed on the third well region; and
    a fourth doping region disposed on the third well region, wherein a second isolation region is disposed between the third doping region and the fourth doping region, wherein the second doping region is connected to the third doping region,
    wherein the second deep well region is separated from the first deep well region,
    wherein the first deep well region and the second deep well region are N type or P type, and
    wherein the substrate comprises a protrusion portion, and the protrusion portion is between the second deep well region and the first deep well region.

2. The semiconductor structure of claim 1, wherein the first deep well region, the second deep well region, the two second well regions, the second doping region, the two fourth well regions, and the fourth doping region are N type, wherein the first well region, the first doping region, the third well region, and the third doping region are P type.

3. The semiconductor structure of claim 2, further comprising:
    a fifth well region disposed between one of the two second well regions and one of the two fourth well regions, wherein the fifth well region is P type.

4. An electrostatic discharge protection circuit, comprising:
    a first diode string comprising a plurality of first diodes, wherein the first diodes are connected in series between an input/output terminal and a power voltage, wherein the first diode string comprises the semiconductor structure of claim 1,
    wherein if a first electrostatic discharge even occurs at the input/output terminal, a first electrostatic discharge current flows through the first diode string.

5. The electrostatic discharge protection circuit of claim 4, wherein the first deep well region, the second deep well region, the two second well regions, the second doping region, the two fourth well regions, and the fourth doping region are N type, wherein the first well region, the first doping region, the third well region, and the third doping region are P type.

6. The electrostatic discharge protection circuit of claim 4, wherein the first doping region is an anode terminal of the first diode string, and the fourth doping region is a cathode terminal of the first diode string.

7. The electrostatic discharge protection circuit of claim 4, further comprising:

a second diode string comprising a plurality of second diodes, wherein the second diodes are connected in series between the input/output terminal and a ground terminal, wherein if a second electrostatic discharge even occurs at the input/output terminal, a second electrostatic discharge current flows to the ground terminal through the second diode string.

8. The electrostatic discharge protection circuit of claim 7, wherein the first electrostatic discharge current is a positive current, and the second electrostatic discharge current is a negative current.

\* \* \* \* \*